United States Patent

Maschek et al.

(12) United States Patent
(10) Patent No.: US 6,959,244 B1
(45) Date of Patent: Oct. 25, 2005

(54) PROCESS FOR GENERATING COLLISION SIGNALS

(75) Inventors: Marko Maschek, Queen's College (GB); Michael Henne, Zaberfeld (DE)

(73) Assignee: Robert Bosch GmbH, Stuttgart (DE)

( * ) Notice: Subject to any disclaimer, the term of this patent is extended or adjusted under 35 U.S.C. 154(b) by 994 days.

(21) Appl. No.: 08/963,720

(22) Filed: Nov. 4, 1997

(30) Foreign Application Priority Data

Nov. 20, 1996 (DE) .......................... 196 41 920

(51) Int. Cl.⁷ .............................. G06F 17/00; G06G 7/78
(52) U.S. Cl. ...................... 701/301; 701/45; 701/46; 701/47; 340/436
(58) Field of Search .................. 340/435, 903, 340/436, 438, 439; 280/734, 735, 703.1; 180/268, 271, 272, 274, 282; 701/300, 301, 36, 45, 46, 47; 303/10.1

(56) References Cited

U.S. PATENT DOCUMENTS

| | | | |
|---|---|---|---|
| 5,036,467 A | | 7/1991 | Blackburn et al. ............. 701/45 |
| 5,067,745 A | * | 11/1991 | Yoshikawa .................. 280/735 |
| 5,073,860 A | * | 12/1991 | Blackburn et al. ............. 701/47 |
| 5,109,341 A | * | 4/1992 | Blackburn et al. ............. 701/47 |
| 5,251,161 A | | 10/1993 | Gioutsos et al. ............... 701/45 |
| 5,345,402 A | * | 9/1994 | Gioutsos et al. ............... 701/47 |
| 5,379,221 A | * | 1/1995 | Schulter et al. ................ 701/47 |
| 5,610,817 A | * | 3/1997 | Mahon et al. ................. 701/46 |
| 5,758,301 A | * | 5/1998 | Saito et al. ................... 701/46 |
| 5,790,404 A | * | 8/1998 | Faye et al. .................... 701/46 |
| 5,801,619 A | * | 9/1998 | Liu et al. ...................... 701/47 |
| 5,814,897 A | * | 9/1998 | Ito et al. ....................... 701/47 |
| 5,815,393 A | * | 9/1998 | Chae ........................... 701/46 |
| 5,936,518 A | * | 8/1999 | Fukui et al. ................. 340/436 |

FOREIGN PATENT DOCUMENTS

| | | |
|---|---|---|
| DE | 196 44 975 | 5/1997 |
| DE | 197 13 087 | 11/1997 |
| EP | 0 590 476 | 4/1994 |

* cited by examiner

*Primary Examiner*—Jacques H. Louis-Jacques
(74) *Attorney, Agent, or Firm*—Kenyon & Kenyon

(57) ABSTRACT

A relatively uncomplicated process for generating collision signals that describe various collision processes involving motor vehicles. The process involves deriving a core signal by low-pass filtering from a collision signal actually measured, splitting this core signal into several signal segments, simulating each signal segment by a transmission function, then combining all the transmission functions into one overall transmission function, and forming one or more new collision signals by varying at least one parameter of the overall transmission function.

6 Claims, 2 Drawing Sheets

PROCESS FOR GENERATING COLLISION SIGNALS

FIELD OF THE INVENTION

The present invention relates to a process for generating signals which describe various collision events in motor vehicles.

BACKGROUND INFORMATION

In the event of a collision, it would be desirable to achieve an optimum, stable triggering response of the installed restraint systems (air bags, seat belts, etc.) for each type of motor vehicle. In other words, the restraint systems should be triggered only when the occupants of the vehicle are actually endangered in a collision, and then the restraints should also be triggered with a very high degree of reliability. Faulty triggering of restraint systems is undesirable because it is very expensive to service the restraint systems; insurance companies in particular have a great interest in preventing faulty triggering of restraint systems as much as possible. Therefore, the algorithm controlling the triggering of restraint systems must be adapted individually to each type of vehicle. Calibration of the triggering algorithm is performed using collision data that reflect the behavior of the vehicle body in a wide variety of collision situations.

There are essentially three categories of collisions —front, side and repair collisions. Repair collisions should not trigger a restraint system, e.g., bumping of vehicles in parking. Repair collisions occur at low vehicle speeds ($\leq 15$ km/h). The number of actual collisions of a vehicle should be greatly limited for cost reasons. However, to make the triggering algorithm as reliable and stable as possible, it would be desirable to have access to a large number of collision signals that describe a wide variety of different collision situations.

It is known from the conference paper of ASL at SAE, no. 920480 that measured collision data can be used to generate new synthetic collision data by mathematical methods to describe other collision situations. However, the mathematical method used there to derive new collision signals is very complicated and requires a long computation time. Furthermore, the collisions synthesized by the known method have a poor correlation with collisions that actually occur.

SUMMARY OF THE INVENTION

An object of the present invention is to provide a process that will make it possible to generate a plurality of new collision signals representing a wide variety of collision situations with minimal use of computing capacity.

This object is achieved due to the fact that a core signal is derived by low-pass filtering from a collision signal actually measured. The core signal is split into several chronologically sequential signal segments, each signal segment is simulated by a transmission function and all the resulting transmission functions are then combined into an overall transmission function. Finally, one or more collision signals are formed by varying at least one parameter of the overall transmission function. The process according to the present invention needs only a single collision signal actually measured to derive a plurality of modified collision signals using a simple mathematical method.

DETAILED DESCRIPTION

Figure 1:
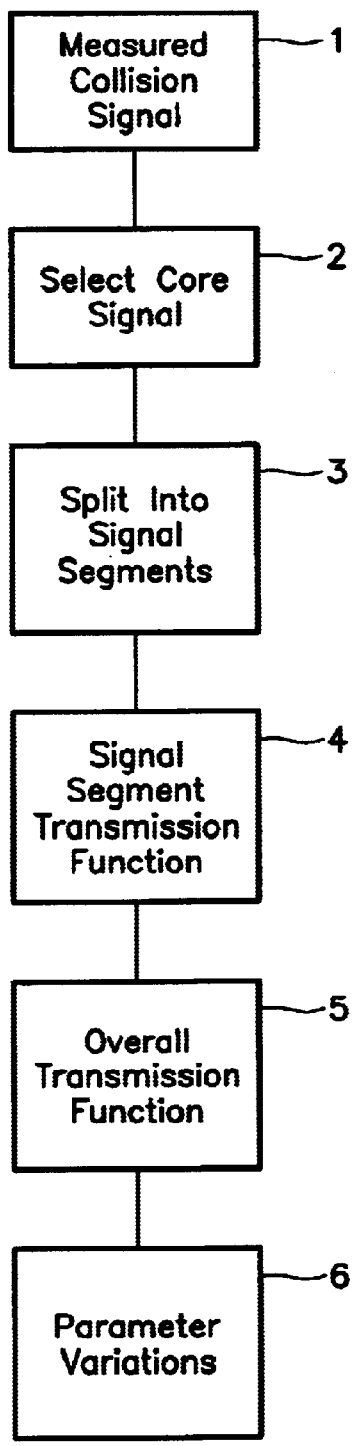
FIG. 1 shows a flow chart for the process for deriving new collision signals according to an exemplary embodiment of the present invention.
Figure 2:
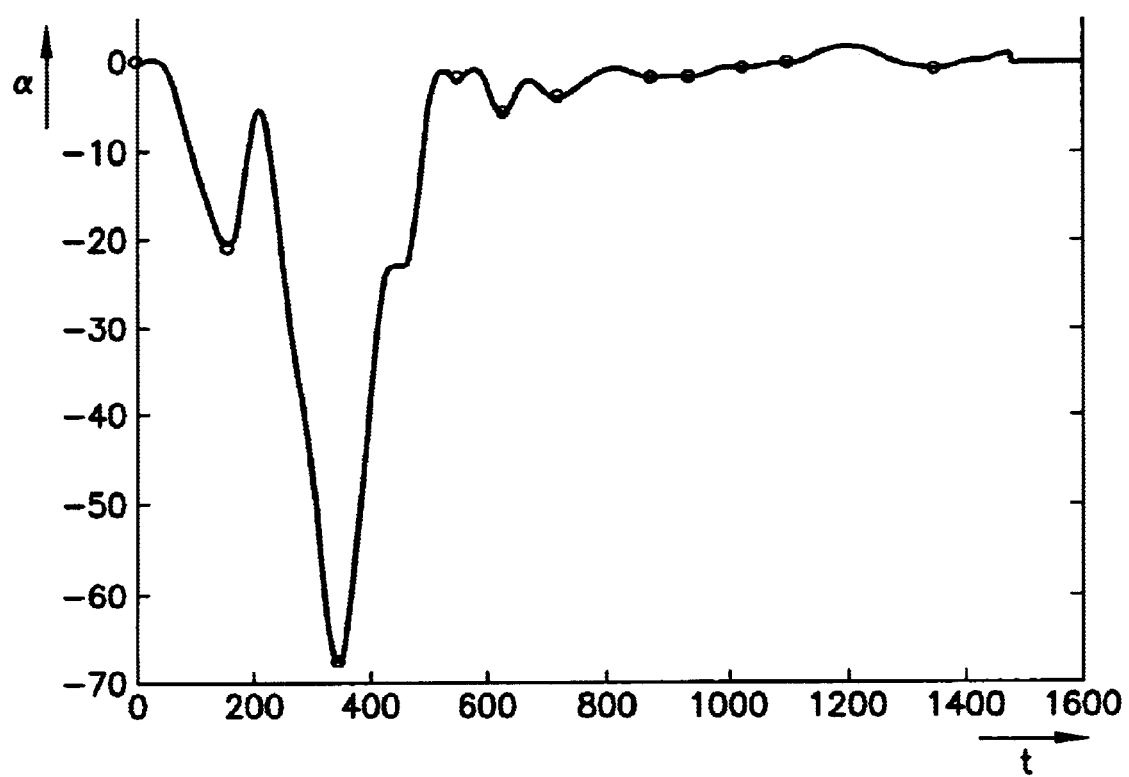
FIG. 2 shows a collision signal curve.

To generate new synthetic collision signals, a collision signal is measured in an actual vehicle collision in a first process step 1 according to FIG. 1 and stored in the form of ASCII data, for example. FIG. 2 shows a collision signal curve measured at a certain location in the vehicle as an example. The collision signal represents the change in acceleration or deceleration (a) measured at one location in the vehicle as a function of time (t) during a collision. It can be seen that at the beginning of a collision, the measured acceleration (a) undergoes very great changes that subside over time. The negative values shown on the ordinate axis of the curve indicate that acceleration (a) is negative here, i.e., the motor vehicle experiences deceleration on impact with another object. Time t is shown in sampling increments on the abscissa of the curve.

In a second process step 2, a core signal is selected from the measured collision signal. To do so, the measured collision signal is sent through a linear FIR filter (filter with a limited pulse response) that has a low-pass characteristic and a cut-off frequency between 80 and 200 Hz. Due to this filtering, short-period signal peaks are filtered out, leaving a smoothed core signal at the filter output. The signal curve illustrated in FIG. 2 is one such core signal filtered out of the measured collision signal. Upstream from the linear FIR filter there may be a non-linear filter (median filter) which eliminates all signal peaks lasting 1 ms or less. The median filter thus performs presmoothing before the linear FIR filter.

The core signal is then split into a plurality of signal segments in process step 3. The boundaries of the individual signal segments, indicated by points in FIG. 2, are preferably set so that each signal segment is a pulse from the overall signal curve. To separate the individual pulses, minimums and points of inflection of the signal curve are first determined with the help of known signal sampling methods. A pulse is either between two minimums or between one minimum and one point of inflection. Whether such a pulse represents a suitable signal segment is determined by comparison of the respective pulse with a model pulse. It is advantageous for the model pulse to be a gaussian pulse that can be varied through two parameters. The first parameter is the pulse width ratio on the right and left of the vertical line of symmetry of the pulse at a certain fraction of the overall pulse amplitude. For example, a ratio of 1:5 between the pulse widths on the right and left of the line of symmetry is defined at 75% of the overall pulse amplitude. The second parameter for the model pulse is the ratio between the pulse amplitudes at the edges on both sides of the line of symmetry. This amplitude ratio may be set at 25%, for example. Only when a pulse selected from the signal curve is inside the limits defined by the model pulse with regard to the pulse width ratio and the pulse amplitude ratio is it treated as a suitable signal segment. A pulse that does not meet these prerequisites is added to the next pulse, and together with it, forms a signal segment.

In the next process step 4, each signal segment is transformed into a simulated signal segment by a transmission function in the z plane. This transmission function has the following form, for example:

$$He(z) = \frac{b0 + b1z^{-1} + b2z^{-2}}{1 + a1z^{-1} + a2z^{-2} + a3z^{-3}} \quad (1)$$

In this transmission function, He(z), according to equation (1), six coefficients b0, b1, b2, a1, a2, a3 are identified for each signal segment.

Then in process step 5, an overall transmission function Hs(z) is formed from all the individual transmission functions He(z) of the signal segments.

This overall transmission function has the following form:

$$Hs(z) = \sum_{i=1}^{z} \sum_{j=0}^{m} \sum_{k=0}^{n} \frac{bjiz^{-1}}{akiz^{-k}} z^{-li} \quad (2)$$

where i is the running index for the signal segments, where s is the number of segments;

j is the running index for the numerator coefficient b, where m is the order of the numerator coefficients;

k is the running index for the denominator coefficient a, where n is the order of the denominator coefficient; and l is a segment vector that runs from one segment to the next and indicates the sampling step at which the respective segment whose transmission function is to be added to the overall transmission function begins.

In process step 6, new collision signals are generated by parameter variations of the overall transmission function Hs(z). Parameter variation means that coefficients a in the overall transmission function are varied. In the transmission function He(z) selected here, coefficients a of the denominator of the overall transmission function Hs(z) form a third-order polynomial in the complex z plane. The roots of this polynomial are the poles of the overall transmission function. Since this is a third-order polynomial, there is a real pole and a conjugated complex pole pair. New collision signal curves are obtained by varying the locus of at least one complex pole within a circle with radius 1 in the complex z plane (a circle with radius 1 describes the stability limit).

Variation of the zero positions, i.e., coefficients b in the numerator, is of no use because it has no effect on the frequency spectrum of the overall transmission function Hs(z) but instead it affects only its amplitude. This variation would create only new collision signals with a varied amplitude but would not alter the shape of the collision signals.

The measure of the variation of the denominator coefficients a of the overall transmission function Hs(z) to generate new collision signals that are as realistic as possible is based on calculations of the correlation and the energy deviation (deviation in effective values) between synthetic collision signals and real collision signals. Experience indicates that variations of 0.1% to 1.0% lead to synthetic collision signals having a close correlation with real collisions.

In deviation from the embodiment described above, an even higher-order transmission function can be used instead of a third-order transmission function. Likewise, even a second-order transmission function can be used.

The process on which the present invention is based makes it possible to derive new collision signals from core signals with a rather high filter cut-off frequency of up to 200 Hz. This guarantees that important information on the collision signal actually measured is preserved in generating synthetic collision signals.

The collision signal actually measured is composed of the core signal selected by filtering and a residual signal. The residual signal can also be varied and superimposed on the varied core signal to synthesize new collision signals.

What is claimed is:

1. A process for generating at least one descriptive collision signal describing motor vehicle collisions, comprising the steps of:

deriving a core signal by low-pass filtering a collision signal actually measured;

splitting the core signal into a plurality of chronologically sequential signal segments;

transforming each of the signal segments into simulated signal segments using a respective transmission function having an input;

combining the transmission functions to form an overall transmission function; and forming the at least one descriptive collision signal by varying at least one parameter of the overall transmission function.

2. The process according to claim 1, wherein the core signal is split into individual pulses.

3. The process according to claim 2, further comprising the step of determining the signal segments by comparing the individual pulses with a model pulse, and accepting one of the individual pulses as an individual signal segment when the individual pulse is within preset limits relative to the model pulse, the model pulse being a gaussian pulse, the gaussian pulse being variable through a plurality of parameters.

4. The process according to claim 1, wherein the signal segments are simulated using the transmission function in a complex z plane in the following manner:

$$He(z) = \frac{b0 + b1z^{-1} + b2z^{-2}}{1 + a1z^{-1} + a2z^{-2} + a3z^{-3}}$$

wherein b0, b1, b2, a1, a2, and a3 are coefficients identified for the signal segments.

5. The process according to claim 1, wherein the overall transmission function is determined in the following manner:

$$Hs(z) = \sum_{i=1}^{z} \sum_{j=0}^{m} \sum_{k=0}^{n} \frac{bjiz^{-1}}{akiz^{-k}} z^{-li}$$

wherein i is a running index for the signal segments, with s being a number of signal segments;

j is a running index for a numerator coefficient b, with m being an order of the numerator coefficient;

k is a running index for a denominator coefficient a, with n being an order of the denominator coefficient; and l is a vector denoting boundaries of the signal segments.

6. The process according to claim 5, wherein at least one complex pole in the overall transmission function is varied to form the at least one descriptive collision signal.

* * * * *

UNITED STATES PATENT AND TRADEMARK OFFICE
CERTIFICATE OF CORRECTION

PATENT NO. : 6,959,244 B1
APPLICATION NO. : 08/963720
DATED : October 25, 2005
INVENTOR(S) : Marko Maschek et al.

It is certified that error appears in the above-identified patent and that said Letters Patent is hereby corrected as shown below:

Column 3, line 15, change " $Hs(z) = \sum_{i=1}^{z} \sum_{j=0}^{m} \sum_{k=0}^{n} \frac{bjiz^{-l}}{akiz^{-k}} z^{-li}$ "

to -- $Hs(z) = \sum_{i=1}^{s} \sum_{j=0}^{m} \sum_{k=0}^{n} \frac{bjiz^{-l}}{akiz^{-k}} z^{-li}$ --

Column 4, line 50, change " $Hs(z) = \sum_{i=1}^{z} \sum_{j=0}^{m} \sum_{k=0}^{n} \frac{bjiz^{-l}}{akiz^{-k}} z^{-li}$ "

to -- $Hs(z) = \sum_{i=1}^{s} \sum_{j=0}^{m} \sum_{k=0}^{n} \frac{bjiz^{-l}}{akiz^{-k}} z^{-li}$ --

Signed and Sealed this

Fourteenth Day of November, 2006

JON W. DUDAS
*Director of the United States Patent and Trademark Office*